(12) United States Patent
Amemiya (10) Patent No.: US 7,777,394 B2
(45) Date of Patent: Aug. 17, 2010

(54) ULTRASONIC TRANSDUCER DRIVING CIRCUIT AND ULTRASONIC DIAGNOSTIC APPARATUS

(75) Inventor: Shinichi Amemiya, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 581 days.

(21) Appl. No.: 11/854,255

(22) Filed: Sep. 12, 2007

(65) Prior Publication Data

US 2008/0071171 A1   Mar. 20, 2008

(30) Foreign Application Priority Data

Sep. 14, 2006   (JP) .............................. 2006-248830

(51) Int. Cl.
  *H03H 9/00* (2006.01)
(52) U.S. Cl. ................... 310/316.03; 310/317; 310/319
(58) Field of Classification Search ............ 310/316.03, 310/317, 319
  See application file for complete search history.

(56) References Cited

U.S. PATENT DOCUMENTS

| | | | |
|---|---|---|---|
| 4,056,761 A | 11/1977 | Jacoby et al. | |
| 4,562,413 A | 12/1985 | Mishiro et al. | |
| 4,642,581 A | 2/1987 | Erickson | |
| 6,525,530 B1 | 2/2003 | Jansson et al. | |
| 7,314,445 B2 * | 1/2008 | Wodnicki et al. | 600/437 |
| 2008/0066552 A1 * | 3/2008 | Amemiya | 73/602 |

FOREIGN PATENT DOCUMENTS

| | | |
|---|---|---|
| JP | 2004-358133 | 12/2004 |
| JP | 2006-101997 | 4/2006 |

* cited by examiner

*Primary Examiner*—Thomas M Dougherty
(74) *Attorney, Agent, or Firm*—Armstrong Teasdale LLP (57) ABSTRACT

With the aim of quickly returning the voltage of an output line to an ultrasonic transducer from a positive voltage or a negative voltage to the ground voltage and reducing the circuit size, immediately after turning on and turning off of a positive FET in accordance with a positive pulse signal, a negative FET goes on for only a pull-back period allowing for the output line to return to the ground voltage. Also, immediately after turning on and turning off of the negative FET in accordance with a negative pulse signal, the positive FET goes on for only a pull-back period allowing for the output line to return to the ground voltage.

20 Claims, 6 Drawing Sheets

FIG. 1
ULTRASONIC DIAGNOSTIC APPARATUS
100

FIG. 2
ULTRASONIC TRANSDUCER DRIVING CIRCUIT
10

FIG. 3

POSITIVE LOGIC CIRCUIT
14P

| PP | PN | LVP | DVP |
|----|----|-----|-----|
| L  | L  | L   | Xh  |
| L  | L  | H   | L   |
| L  | H  | L   | Xh  |
| L  | H  | H   | Xh  |
| H  | L  | L   | L   |
| H  | L  | H   | H   |
| H  | H  | L   | H   |
| H  | H  | H   | H   |

NEGATIVE LOGIC CIRCUIT
14N

| PP | PN | LVN | DVN |
|----|----|-----|-----|
| L  | L  | L   | L   |
| L  | L  | H   | L   |
| L  | H  | L   | Xl  |
| L  | H  | H   | Xl  |
| H  | L  | L   | L   |
| H  | L  | H   | H   |
| H  | H  | L   | H   |
| H  | H  | H   | H   |

|     | PP | PN | LVP | LVN | DVP | DVN |
|-----|----|----|----|----|----|----|
| T1  | H  | L  | H  | L  | H  | L  |
| T2f | L  | L  | H  | L  | L  | L  |
| T2  | L  | L  | H  | H  | L  | L  |
| T2d | H  | L  | H  | H  | H  | H  |
| T3  | H  | L  | H  | L  | H  | L  |
| T4f | H  | H  | H  | L  | H  | H  |
| T4  | H  | H  | L  | L  | H  | H  |
| T4d | H  | L  | L  | L  | L  | L  |
| T5  | H  | L  | H  | L  | H  | L  |

|     | PP | PN | LVP | LVN | DVP | DVN |
|-----|----|----|-----|-----|-----|-----|
| T1  | H  | L  | H   | L   | H   | L   |
| T2f | L  | L  | H   | L   | L   | L   |
| T2  | L  | L  | H   | H   | L   | L   |
| T4h | H  | H  | H   | H   | H   | H   |
| T4f | H  | H  | H   | L   | H   | H   |
| T4  | H  | H  | L   | L   | H   | H   |
| T4d | H  | L  | L   | L   | L   | L   |
| T5  | H  | L  | H   | L   | H   | L   |

ULTRASONIC TRANSDUCER DRIVING CIRCUIT AND ULTRASONIC DIAGNOSTIC APPARATUS

CROSS REFERENCE TO RELATED APPLICATIONS

This application claims the benefit of Japanese Application No. 2006-248830 filed Sep. 14, 2006.

BACKGROUND OF THE INVENTION

The present invention relates to an ultrasonic transducer driving circuit and an ultrasonic diagnostic apparatus and, more particularly, relates to an ultrasonic transducer driving circuit and an ultrasonic diagnostic apparatus that make it possible to quickly return, from a positive voltage or negative voltage to a ground voltage, the voltage of an output line which outputs the positive voltage or the negative voltage or the ground voltage to an ultrasonic transducer, and that allow for a reduction in circuit size.

Heretofore, there is known an ultrasonic diagnostic apparatus including a positive FET (Field Effect Transistor) which outputs a positive voltage onto an output line to an ultrasonic transducer at on state, a negative FET which outputs a negative voltage onto the output line to the ultrasonic transducer at on state, and a driver circuit which turns the positive FET and the negative FET on/off (e.g., see Patent Document 1 and Patent Document 2). [Patent Document 1] Japanese Unexamined Patent Publication No. 2006-101997 (FIG. 10, FIG. 12, FIG. 14)

[Patent Document 2] Japanese Unexamined Patent Publication No. 2004-358133 (FIG. 2)

The above ultrasonic diagnostic apparatus of prior art has a problem in which, when a pulse of a positive voltage or negative voltage is applied to the output line, the voltage on the output line does not quickly return from the positive voltage or negative voltage to the ground voltage because of capacitance of the output line.

To address this, it is conceivable to incorporate an active ground clamp circuit that forcibly returns the output line to the ground voltage. However, a FET with a capacity of 1 A or more is needed in the active ground clamp circuit and this poses a problem that the circuit size becomes larger.

SUMMARY OF THE INVENTION

In a first aspect, the present invention provides an ultrasonic transducer driving circuit characterized by comprising a positive field effect transistor which outputs a positive voltage onto an output line to an ultrasonic transducer at on state, a negative field effect transistor which outputs a negative voltage onto the output line to the ultrasonic transducer at on state, and a driver circuit which carries out at least one of turning on of said negative field effect transistor for only a pull-back period allowing for said output line to return to the ground voltage immediately after turning on and turning off said positive field effect transistor in accordance with a positive pulse signal supplied, and turning on of said positive field effect transistor for only a pull-back period allowing for said output line to return to the ground voltage immediately after turning on and turning off said negative field effect transistor in accordance with a negative pulse signal supplied.

In the ultrasonic transducer driving circuit according to the above first aspect, immediately after turning on and turning off of the positive field effect transistor in accordance with the positive pulse signal, turning on of the negative field effect transistor for only the pull-back period occurs to forcibly return the output line to the ground voltage; thus, the voltage on the output line can quickly be returned from the positive voltage to the ground voltage. Also, immediately after turning on and turning off of the negative field effect transistor in accordance with the negative pulse signal, turning on of the positive field effect transistor for only the pull-back period occurs to forcibly return the output line to the ground voltage; thus, the voltage on the output line can quickly be returned from the negative voltage to the ground voltage. Since the driver circuit is a logic circuit through which only little current flows, its circuit size can be made smaller as compared with an active ground clamp circuit.

In a second aspect, the present invention provides an ultrasonic transducer driving circuit characterized in that said driver circuit in the ultrasonic transducer driving circuit according to said first aspect drives the positive field effect transistor and the negative field effect transistor based on said positive pulse signal, said negative pulse signal, and a return voltage returned from said output line.

In the ultrasonic transducer driving circuit according to the above second aspect, the return voltage returned from the output line is used; thus, the pull-back period for returning the voltage on the output line from the positive voltage or negative voltage to the ground voltage can be determined properly.

In a third aspect, the present invention provides an ultrasonic transducer driving circuit characterized in that said driver circuit in the ultrasonic transducer driving circuit according to said second aspect comprises a positive driver circuit which drives said positive field effect transistor and a negative driver circuit which drives said negative field effect transistor.

In the ultrasonic transducer driving circuit according to the above third aspect, the positive driver circuit and the negative driver circuit are separate; thus, each respective logic circuit becomes easy to construct.

In a forth aspect, the present invention provides an ultrasonic transducer driving circuit characterized in that said positive driver circuit in the ultrasonic transducer driving circuit according to said third aspect includes: a positive comparator which compares a positive threshold and said return voltage; and a positive logic circuit which outputs a drive signal based on said positive pulse signal, said negative pulse signal, and an output voltage of said positive comparator.

In the ultrasonic transducer driving circuit according to the above fourth aspect, the pull-back period can be adjusted by adjusting the positive threshold.

In a fifth aspect, the present invention provides an ultrasonic transducer driving circuit characterized in that said positive threshold in the ultrasonic transducer driving circuit according to said fourth aspect is a voltage depending on a negative transmit voltage.

In the ultrasonic transducer driving circuit according to the above fifth aspect, the pull-back period can be terminated slightly before returning from the negative voltage to the ground voltage, e.g., at 0% to 20% of the negative voltage; thus, a large overshoot can be prevented from occurring.

In a sixth aspect, the present invention provides an ultrasonic transducer driving circuit characterized in that said native driver circuit in the ultrasonic transducer driving circuit according to any of said third through fifth aspects includes: a negative comparator which compares a negative threshold with said return voltage; and a negative logic circuit which outputs a drive signal based on said positive pulse signal, said negative pulse signal, and an output voltage of said negative comparator.

In the ultrasonic transducer driving circuit according to the above sixth aspect, the pull-back period can be adjusted by adjusting the negative threshold.

In a seventh aspect, the present invention provides an ultrasonic transducer driving circuit characterized in that said negative threshold in the ultrasonic transducer driving circuit according to said sixth aspect is a voltage depending on a positive transmit voltage.

In the ultrasonic transducer driving circuit according to the above seventh aspect, the pull-back period can be terminated slightly before returning from the positive voltage to the ground voltage, e.g., at 0% to 20% of the positive voltage; thus, a large overshoot can be prevented from occurring.

In an eighth aspect, the present invention provides an ultrasonic diagnostic apparatus characterized by comprising an ultrasonic probe, an ultrasonic transducer driving circuit according to any of said first through seventh aspects, a receiver circuit which receives echo signals acquired at said ultrasonic probe and outputs an acoustic beam signal, an image generating means which generates an ultrasonic image based on said acoustic beam signal, and a display means which displays said ultrasonic image.

In the ultrasonic diagnostic apparatus according to the above eighth aspect, the size of the ultrasonic transducer driving circuit can be reduced.

According to the ultrasonic transducer driving circuit and the ultrasonic diagnostic apparatus of the present invention, the voltage on the output line can quickly be returned from the positive voltage or negative voltage to the ground voltage. Besides, the circuit size can be reduced.

The ultrasonic transducer driving circuit and the ultrasonic diagnostic apparatus of the present invention can be utilized to improve the performance of ultrasonic diagnostic apparatus and reduce the size thereof.

Further objects and advantages of the present invention will be apparent from the following description of the preferred embodiments of the invention as illustrated in the accompanying drawings.

DETAILED DESCRIPTION OF THE INVENTION

In the following, the present invention will be described in more detail by way of its embodiments that are shown in the drawings. These embodiments are not intended to limit the present invention.

Embodiment 1

Figure 1:
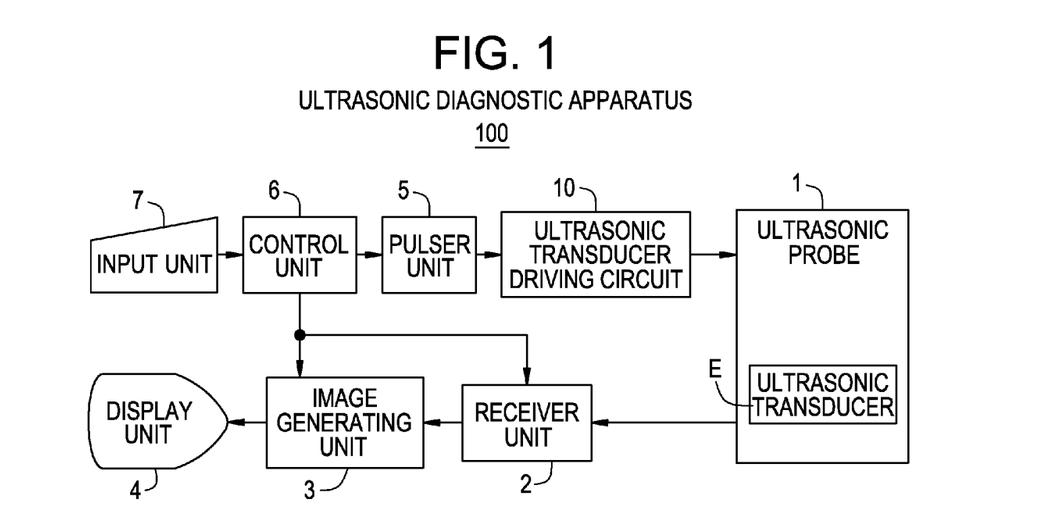
FIG. 1 is a block diagram showing an ultrasonic diagnostic apparatus relevant to Embodiment 1.

FIG. 1 is a structural diagram showing an ultrasonic diagnostic apparatus 100 relevant to Embodiment 1.

This ultrasonic diagnostic apparatus 100 comprises an ultrasonic probe 1 within which multiple ultrasonic transducers E are installed to transmit ultrasonic pulses from the transducer into a specimen body and receives ultrasonic echoes from within the specimen body, a receiver unit 2 which generates and outputs an acoustic beam signal from the ultrasonic echoes, an image generating unit 3 which generates an ultrasonic image based on the acoustic beam signal, a display unit 4 which displays the ultrasonic image, an ultrasonic transducer driving circuit 10 which drives the ultrasonic transducer E for transmitting the ultrasonic pulses, a pulser unit 5 which inputs a signal for transmission to the ultrasonic transducer driving circuit 10, a control unit 6 which takes overall control of the apparatus, and an input unit 7 which is used for an operator to operate the apparatus.

Figure 2:
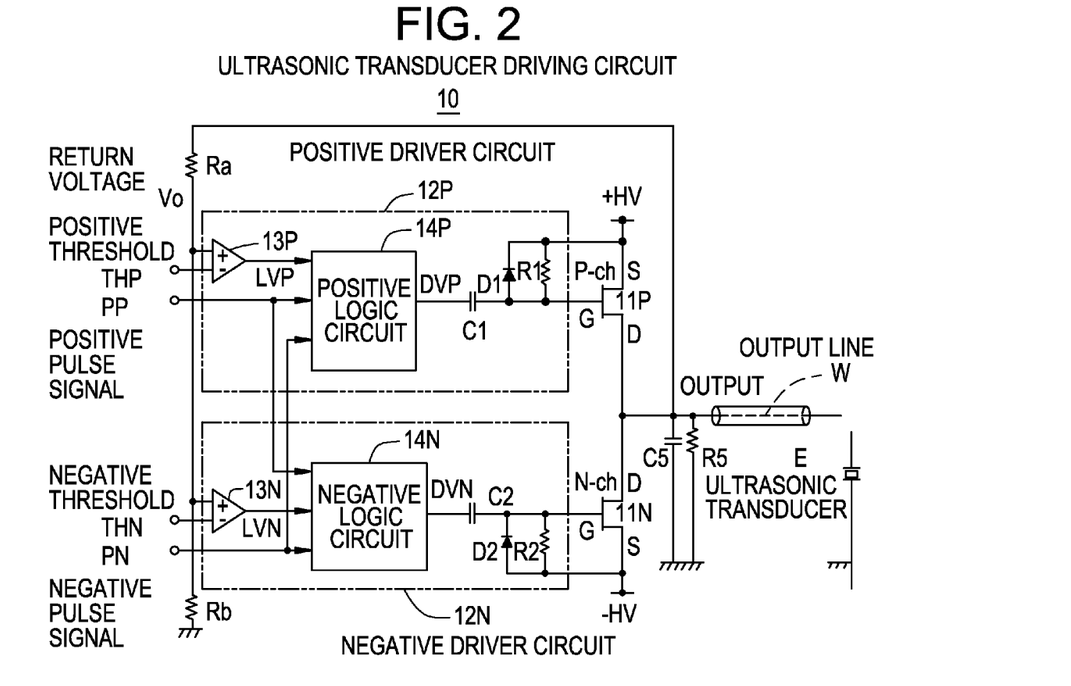
FIG. 2 is a circuit diagram showing an ultrasonic transducer driving circuit relevant to Embodiment 1.

FIG. 2 is a circuit diagram showing the ultrasonic transducer driving circuit 10 relevant to Embodiment 1.

The ultrasonic transducer driving circuit 10 comprises a positive FET 11P which outputs a positive voltage +HV onto an output line W to the ultrasonic transducer E at on state, a negative FET 11N which outputs a negative voltage −HV onto the output line W at on state, a positive driver circuit 12P which drives the positive FET 11P based on a positive pulse signal PP and a negative pulse signal supplied from the pulser unit 5 as well as a positive threshold THP and a return voltage Vo returned from the output line W, and a negative driver circuit 12N which drives the negative FET 11N based on the positive pulse signal PP and the negative pulse signal PN as well as a negative threshold THN and the return voltage Vo.

The positive threshold THP is a value in relation to the negative voltage −HV as a transmit voltage and is supplied from the pulser unit 5.

The negative threshold THN is a value in relation to the positive voltage +HV as a transmit voltage and is supplied from the pulser unit 5.

The positive driver circuit 12P includes: a comparator 13P which outputs a positive comparison signal LVP being "H" when the return voltage Vo is higher than the positive threshold THP and "L" otherwise; and a positive logic circuit 14P which outputs a positive drive signal DVP based on the positive pulse signal PP, the negative pulse signal PN, and the positive comparison signal LVP.

The negative driver circuit 12N includes: a comparator 13N which outputs a negative comparison signal LVN being "H" when the return voltage Vo is higher than the negative threshold THN and "L" otherwise; and a negative logic circuit 14N which outputs a negative drive signal DVN based on the positive pulse signal PP, the negative pulse signal PN, and the positive comparison signal LVN.

A resistor R5 and a capacitor C5 which are shown in FIG. 2 are omissible.

Figure 3:
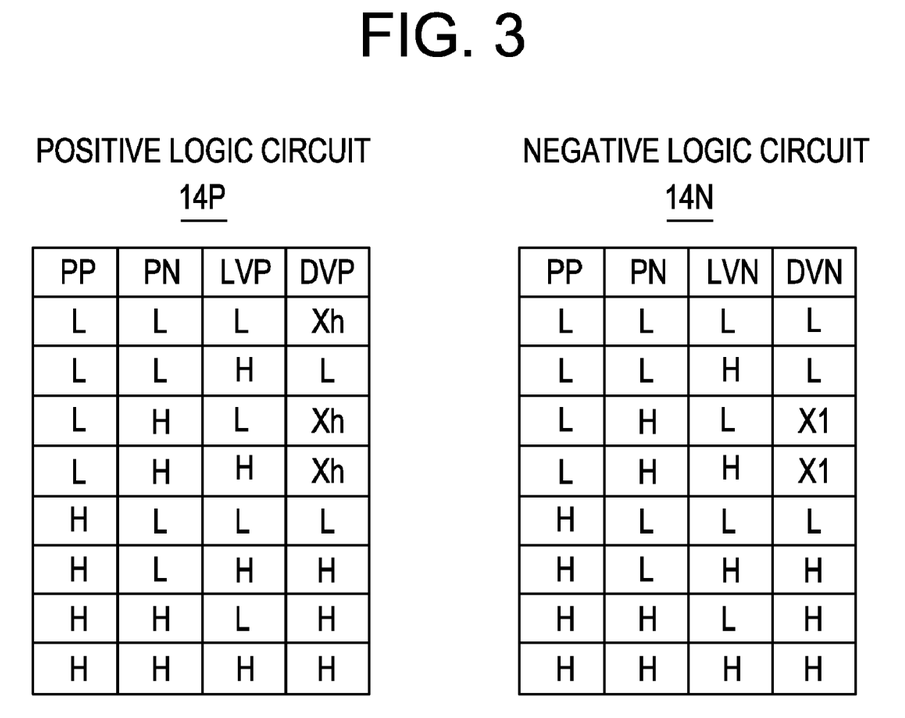
FIG. 3 shows the true tables for a positive logic circuit and a negative logic circuit relevant to Embodiment 1.

FIG. 3 shows a true table listing logic values of the positive logic circuit 14P and a true table listing logic values of the negative logic circuit 14N.

"Xh" denotes that it is desirably "H" from a fail-safe perspective, although it may be either "H" or "L".

"Xl" denotes that it is desirably "L" from the fail-safe perspective, although it may be either "H" or "L".

Figure 4:
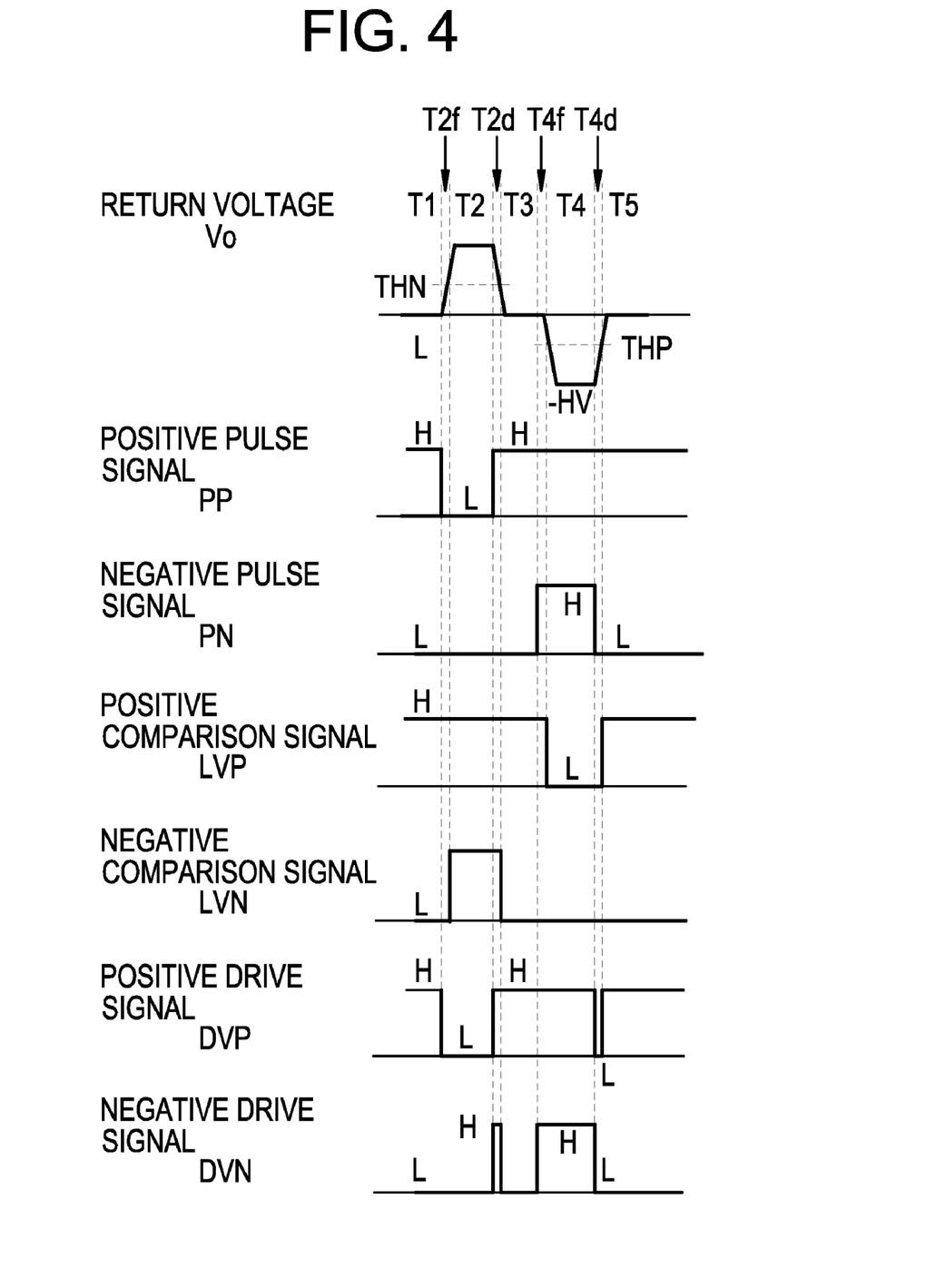
FIG. 4 is a timing chart for a period in which a positive voltage is applied to an ultrasonic transducer, followed by a return to the ground voltage and application of a negative voltage.
Figure 5:
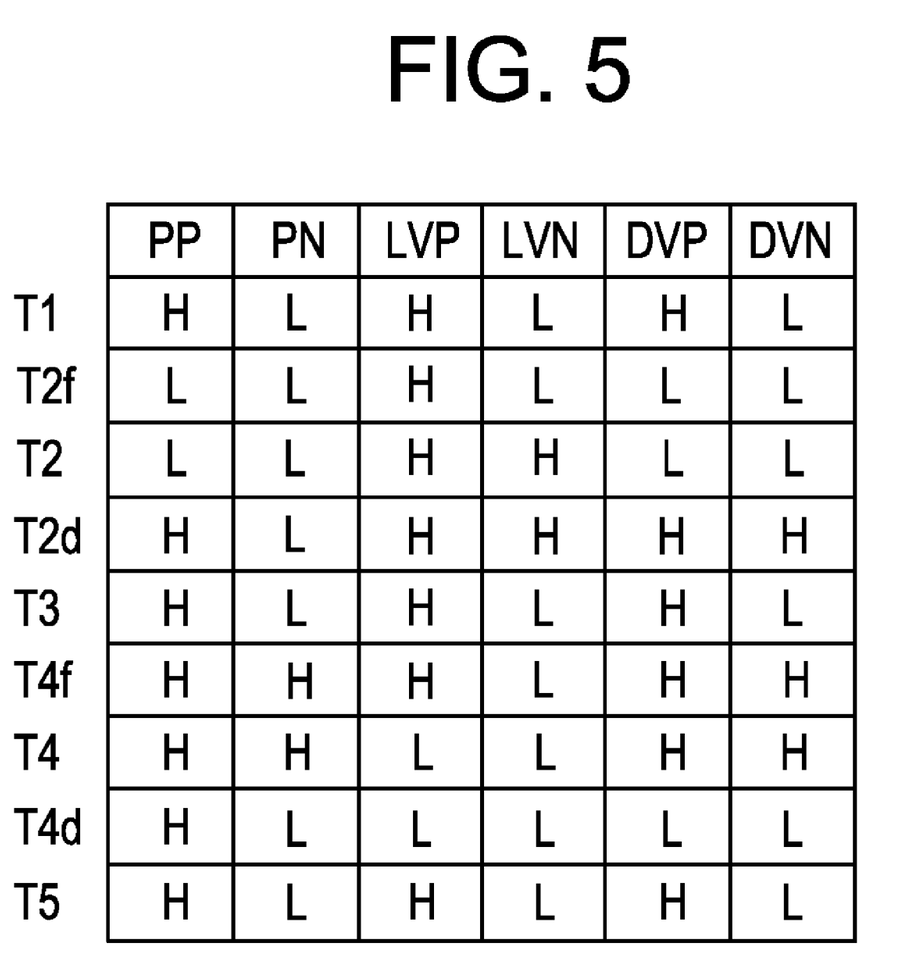
FIG. 5 lists the logical values of the signals for each time phase in FIG. 4.

FIG. 4 is a timing chart for a period in which the positive voltage +HV is applied to the ultrasonic transducer E, followed by a return to the ground voltage and application of the negative voltage −HV. FIG. 5 lists the logical values of the signals for each time phase.

When the positive drive signal DVP is "L", the positive FET 11P is in on state. When the negative drive signal DVN is "H", the negative FET 11N is in on state.

As can be seen from the positive drive signal DVP and the negative drive signal DVN, immediately after turning on and turning off of the positive FET 11P in accordance with the positive pulse signal PP, turning on of the negative FET 11N for only a short pull-back period T2$d$ occurs, thereby quickly returning the output line L to the ground voltage. Also, immediately after turning on and turning off of the negative FET in accordance with the negative pulse signal PN, turning on of the positive FET 11P for only a short pull-back period T4$d$ occurs, thereby quickly returning the output line L to the ground voltage.

Figure 6:
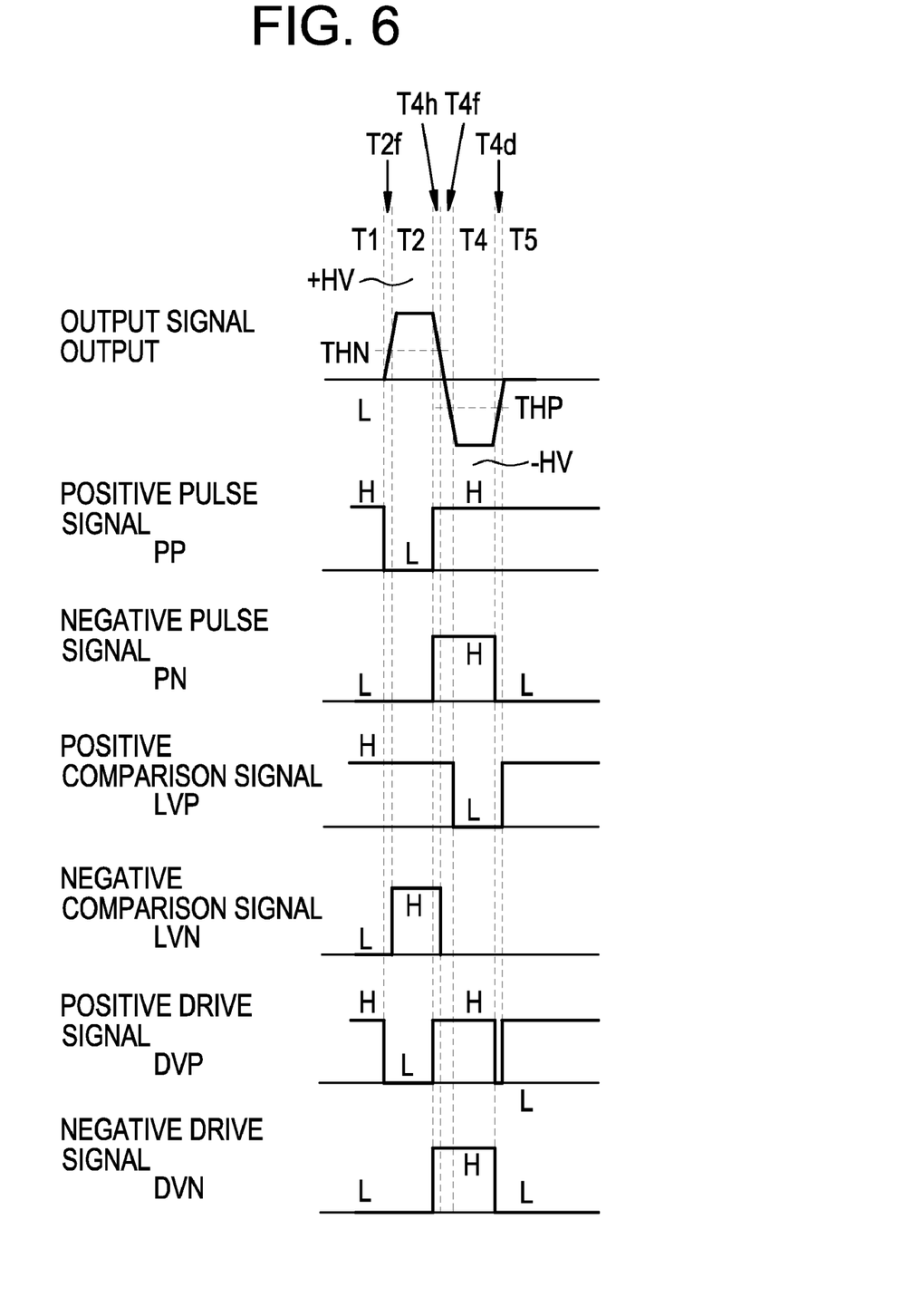
FIG. 6 is a timing chart for a period in which the positive voltage is applied to the ultrasonic transducer, followed by application of the negative voltage.
Figure 7:
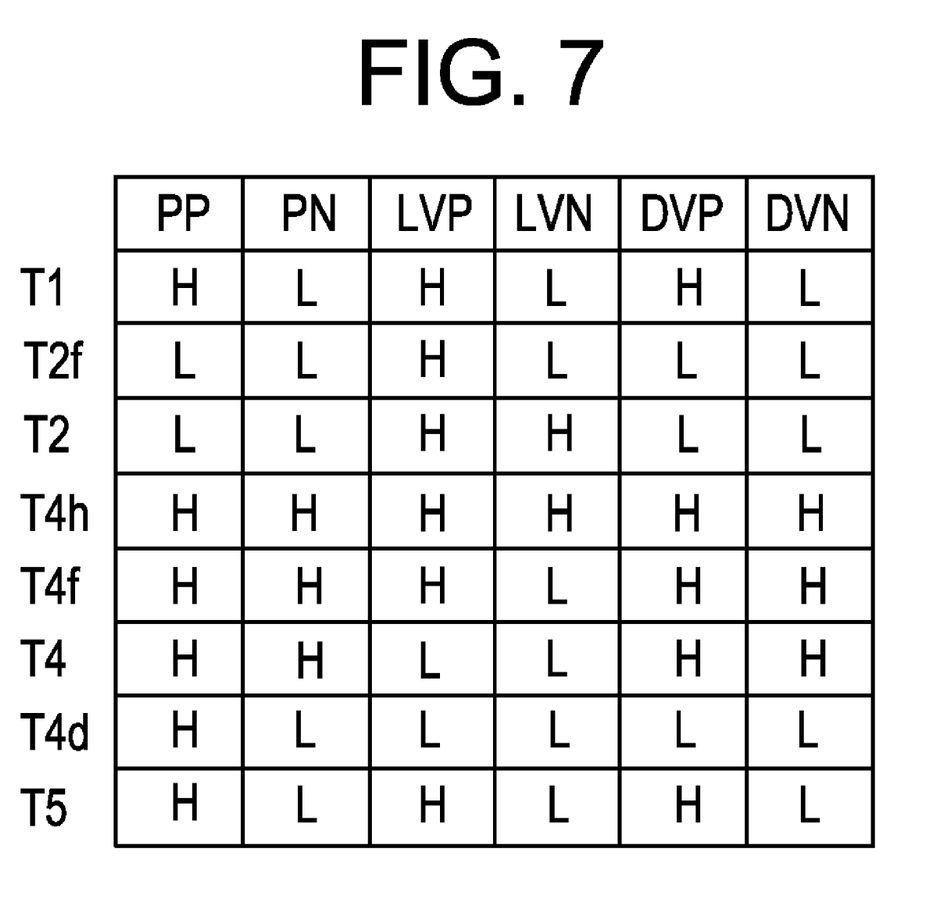
FIG. 7 lists the logical values of the signals for each time phase in FIG. 6.

FIG. 6 is a timing chart for a period in which the positive voltage +HV is applied to the ultrasonic transducer E, followed by application of the negative voltage –HV. FIG. 7 lists the logical values of the signals for each time phase.

As can be seen from the positive drive signal DVP and the negative drive signal DVN, immediately after turning on and turning off of the negative FET 11N in accordance with the negative pulse signal PN, turning on of the positive FET 11P for only a short pull-back period T4$d$ occurs, thereby quickly returning the output line L to the ground voltage.

According to the ultrasonic transducer driving circuit 10 and the ultrasonic transducer driving circuit 100 of Embodiment 1, immediately after turning on and turning off of the positive FET 11P in accordance with the positive pulse signal PP, turning on of the negative FET 11N for only the pull-back period T2$d$ occurs and, thus, the voltage on the output line W can quickly be returned from the positive voltage +HV to the ground voltage. Also, immediately after turning on and turning off of the negative FET 11N in accordance with the negative pulse signal PN, turning on of the positive FET 11P for only the pull-back period T4$d$ occurs and, thus, the voltage on the output line W can quickly be returned from the negative voltage –HV to the ground voltage. Since the driver circuits 12P, 12N are logic circuits through which only little current flows, their circuit size can be made smaller as compared with an active ground clamp circuit.

Embodiment 2

The present invention can be applied in the same manner as for Embodiment 1, when the negative voltage –HV is applied to the ultrasonic transducer E, followed by a return to the ground voltage and application of the positive voltage +HV, and even when the negative voltage –HV is applied to the ultrasonic transducer E, followed by application of the positive voltage +HV.

Many widely different embodiments of the invention may be configured without departing from the spirit and the scope of the present invention. It should be understood that the present invention is not limited to the specific embodiments described in the specification, except as defined in the appended claims.

The invention claimed is:

1. An ultrasonic transducer driving circuit comprising:
a positive field effect transistor which outputs a positive voltage onto an output line to an ultrasonic transducer at on state;
a negative field effect transistor which outputs a negative voltage onto the output line to the ultrasonic transducer at on state; and
a driver circuit which carries out at least one of turning on of said negative field effect transistor for only a pull-back period allowing for said output line to return to the ground voltage immediately after turning on and turning off said positive field effect transistor in accordance with a positive pulse signal supplied, and turning on of said positive field effect transistor for only a pull-back period allowing for said output line to return to the ground voltage immediately after turning on and turning off said negative field effect transistor in accordance with a negative pulse signal supplied.

2. The ultrasonic transducer driving circuit according to claim 1, wherein said driver circuit drives said positive field effect transistor and said negative field effect transistor based on said positive pulse signal, said negative pulse signal, and a return voltage returned from said output line.

3. The ultrasonic transducer driving circuit according to claim 2, wherein said driver circuit comprises a positive drive circuit which drives said positive field effect transistor and a negative drive circuit which drives said negative field effect transistor.

4. The ultrasonic transducer driving circuit according to claim 3, wherein said positive drive circuit includes: a positive comparator which compares a positive threshold and said return voltage; and a positive logic circuit which outputs a drive signal based on said positive pulse signal, said negative pulse signal, and an output voltage of said positive comparator.

5. The ultrasonic transducer driving circuit according to claim 4, wherein said positive threshold is a voltage depending on a negative transmit voltage.

6. The ultrasonic transducer driving circuit according to claim 3, wherein said negative drive circuit includes: a negative comparator which compares a negative threshold with said return voltage; and a negative logic circuit which outputs a drive signal based on said positive pulse signal, said negative pulse signal, and an output voltage of said negative comparator.

7. The ultrasonic transducer driving circuit according to claim 4, wherein said negative drive circuit includes: a negative comparator which compares a negative threshold with said return voltage; and a negative logic circuit which outputs a drive signal based on said positive pulse signal, said negative pulse signal, and an output voltage of said negative comparator.

8. The ultrasonic transducer driving circuit according to claim 5, wherein said negative drive circuit includes: a negative comparator which compares a negative threshold with said return voltage; and a negative logic circuit which outputs a drive signal based on said positive pulse signal, said negative pulse signal, and an output voltage of said negative comparator.

9. The ultrasonic transducer driving circuit according to claim 6, wherein said negative threshold is a voltage depending on a positive transmit voltage.

10. The ultrasonic transducer driving circuit according to claim 7, wherein said negative threshold is a voltage depending on a positive transmit voltage.

11. An ultrasonic diagnostic apparatus comprising: an ultrasonic probe, an ultrasonic transducer driving circuit as recited in claim 1; a receiver circuit which receives echo signals acquired at said ultrasonic probe and outputs an acoustic beam signal; an image generating device which generates an ultrasonic image based on said acoustic beam signal; and a display device which displays said ultrasonic image.

12. An ultrasonic diagnostic apparatus comprising: an ultrasonic probe, an ultrasonic transducer driving circuit as recited in claim 2; a receiver circuit which receives echo signals acquired at said ultrasonic probe and outputs an acoustic beam signal; an image generating device which generates an ultrasonic image based on said acoustic beam signal; and a display device which displays said ultrasonic image.

13. An ultrasonic diagnostic apparatus comprising: an ultrasonic probe, an ultrasonic transducer driving circuit as recited in claim 3; a receiver circuit which receives echo signals acquired at said ultrasonic probe and outputs an acoustic beam signal; an image generating device which generates an ultrasonic image based on said acoustic beam signal; and a display device which displays said ultrasonic image.

14. An ultrasonic diagnostic apparatus comprising: an ultrasonic probe, an ultrasonic transducer driving circuit as recited in claim 4; a receiver circuit which receives echo signals acquired at said ultrasonic probe and outputs an acoustic beam signal; an image generating device which generates an ultrasonic image based on said acoustic beam signal; and a display device which displays said ultrasonic image.

15. An ultrasonic diagnostic apparatus comprising: an ultrasonic probe, an ultrasonic transducer driving circuit as recited in claim 5; a receiver circuit which receives echo signals acquired at said ultrasonic probe and outputs an acoustic beam signal; an image generating device which generates an ultrasonic image based on said acoustic beam signal; and a display device which displays said ultrasonic image.

16. An ultrasonic diagnostic apparatus comprising: an ultrasonic probe, an ultrasonic transducer driving circuit as recited in claim 6; a receiver circuit which receives echo signals acquired at said ultrasonic probe and outputs an acoustic beam signal; an image generating device which generates an ultrasonic image based on said acoustic beam signal; and a display device which displays said ultrasonic image.

17. An ultrasonic diagnostic apparatus comprising: an ultrasonic probe, an ultrasonic transducer driving circuit as recited in claim 7; a receiver circuit which receives echo signals acquired at said ultrasonic probe and outputs an acoustic beam signal; an image generating device which generates an ultrasonic image based on said acoustic beam signal; and a display device which displays said ultrasonic image.

18. An ultrasonic diagnostic apparatus comprising: an ultrasonic probe, an ultrasonic transducer driving circuit as recited in claim 8; a receiver circuit which receives echo signals acquired at said ultrasonic probe and outputs an acoustic beam signal; an image generating device which generates an ultrasonic image based on said acoustic beam signal; and a display device which displays said ultrasonic image.

19. An ultrasonic diagnostic apparatus comprising: an ultrasonic probe, an ultrasonic transducer driving circuit as recited in claim 9; a receiver circuit which receives echo signals acquired at said ultrasonic probe and outputs an acoustic beam signal; an image generating device which generates an ultrasonic image based on said acoustic beam signal; and a display device which displays said ultrasonic image.

20. An ultrasonic diagnostic apparatus comprising: an ultrasonic probe, an ultrasonic transducer driving circuit as recited in claim 10; a receiver circuit which receives echo signals acquired at said ultrasonic probe and outputs an acoustic beam signal; an image generating device which generates an ultrasonic image based on said acoustic beam signal; and a display device which displays said ultrasonic image.

* * * * *